United States Patent [19]

Mahoney

[11] Patent Number: 5,521,351
[45] Date of Patent: May 28, 1996

[54] METHOD AND APPARATUS FOR PLASMA SURFACE TREATMENT OF THE INTERIOR OF HOLLOW FORMS

[75] Inventor: Leonard J. Mahoney, Madison, Wis.

[73] Assignee: Wisconsin Alumni Research Foundation, Madison, Wis.

[21] Appl. No.: 298,333

[22] Filed: Aug. 30, 1994

[51] Int. Cl.$^6$ .................................................. B23K 10/00
[52] U.S. Cl. ............................ 219/121.59; 219/121.43; 219/121.51; 156/345; 427/230; 427/237; 427/238; 118/723 R; 118/733
[58] Field of Search .......................... 219/121.59, 121.4, 219/121.44, 121.43, 121.51; 156/345, 643, 646; 427/563, 231, 237, 238, 230; 118/723 MP, 723 E, 723 R, 728, 733

[56] References Cited

U.S. PATENT DOCUMENTS

| | | | |
|---|---|---|---|
| 4,016,389 | 5/1977 | White | 219/10.49 R |
| 4,568,563 | 2/1986 | Jackson et al. | 427/40 |
| 4,869,203 | 9/1989 | Pinkhasov | 118/723 |
| 4,948,458 | 8/1989 | Ogle . | |
| 5,226,967 | 7/1993 | Chen et al. . | |
| 5,234,529 | 8/1993 | Johnson . | |
| 5,241,245 | 8/1993 | Barnes et al. . | |
| 5,261,962 | 11/1993 | Hamamoto et al. . | |
| 5,277,751 | 1/1994 | Ogle . | |
| 5,280,154 | 1/1994 | Cuomo et al. . | |
| 5,374,314 | 12/1994 | Babacz | 118/723 MP |
| 5,378,510 | 1/1995 | Thomas et al. | 427/563 |

FOREIGN PATENT DOCUMENTS

| | | |
|---|---|---|
| 0379828 | 8/1990 | European Pat. Off. . |
| 3908418 | 3/1989 | Germany . |
| 3632748 | 4/1989 | Germany . |
| 3933874 | 10/1989 | Germany . |

OTHER PUBLICATIONS

J. T. Felts, et al., "Commercial–Scale Application of Plasma Processing for Polymeric Substrates: From Laboratory to Production," presented at 38th Annual Symposium and Topical Conferences of the American Vacuum Society, Seattle, WA, Nov. 11–15, 1991; published in J. Vac. Sci. Technol., A10, 1992, p. 1675.

J. Hopwood, et al., "Electromagnetic Fields in a Radio Frequency Induction Plasma," Research Report, IBM Research Division, T. J. Watson Research Center, 1992, JVST A, No. 11, p. 147.

J. Hopwood, et al., "Langmuir Probe Measurements of an RF Induction Plasma," Research Report, IBM Research Division, T. J. Watson Research Center, 1992, JVST A, No. 11, p. 152.

G. Menges, et al., "Plasma Polymerisation—Tailored Coats for Plastic Mouldings," Kunststoffe German Plastics, vol. 78, No. 10, 1988, pp. 91–92.

P. Plein, et al., "Plasmapolymerization as Coating Process for Plastic and Metallic Parts," Antec '88, 1988, pp. 1338–1341.

R. Ludwig, "Plasmapolymerization—A New Technology for Surface Modification," Antec '89, 1989, pp. 915–917.

*Primary Examiner*—Mark H. Paschall
*Attorney, Agent, or Firm*—Foley & Lardner

[57] ABSTRACT

A plasma is generated within the interior of a hollow form held within a vacuum chamber enclosure by utilizing a radio frequency coil mounted within the vacuum chamber and defining a working volume which closely conforms to the shape of the hollow form. The hollow form and the interior of the vacuum chamber are evacuated to a low pressure, and a gas is introduced into the interior of the hollow form to maintain the pressure within the form higher than the pressure in the vacuum chamber outside of the form. Radio frequency electrical power is supplied to the coil to induce an electric field within the form which is sufficient to break down the gas within the form to form a plasma at the pressure of the gas within the form, but does not break down the gas at the lower pressure in the vacuum chamber outside of the hollow form. The interior of hollow forms having complex shapes can be treated using two or more coils arranged to treat distinct portions of the form, and the shape of the coils and the manner in which power is supplied to the coils can be selected to control the spatial distribution of the plasma within the hollow form.

22 Claims, 12 Drawing Sheets

Typical Curve for Gas Discharge Break Down

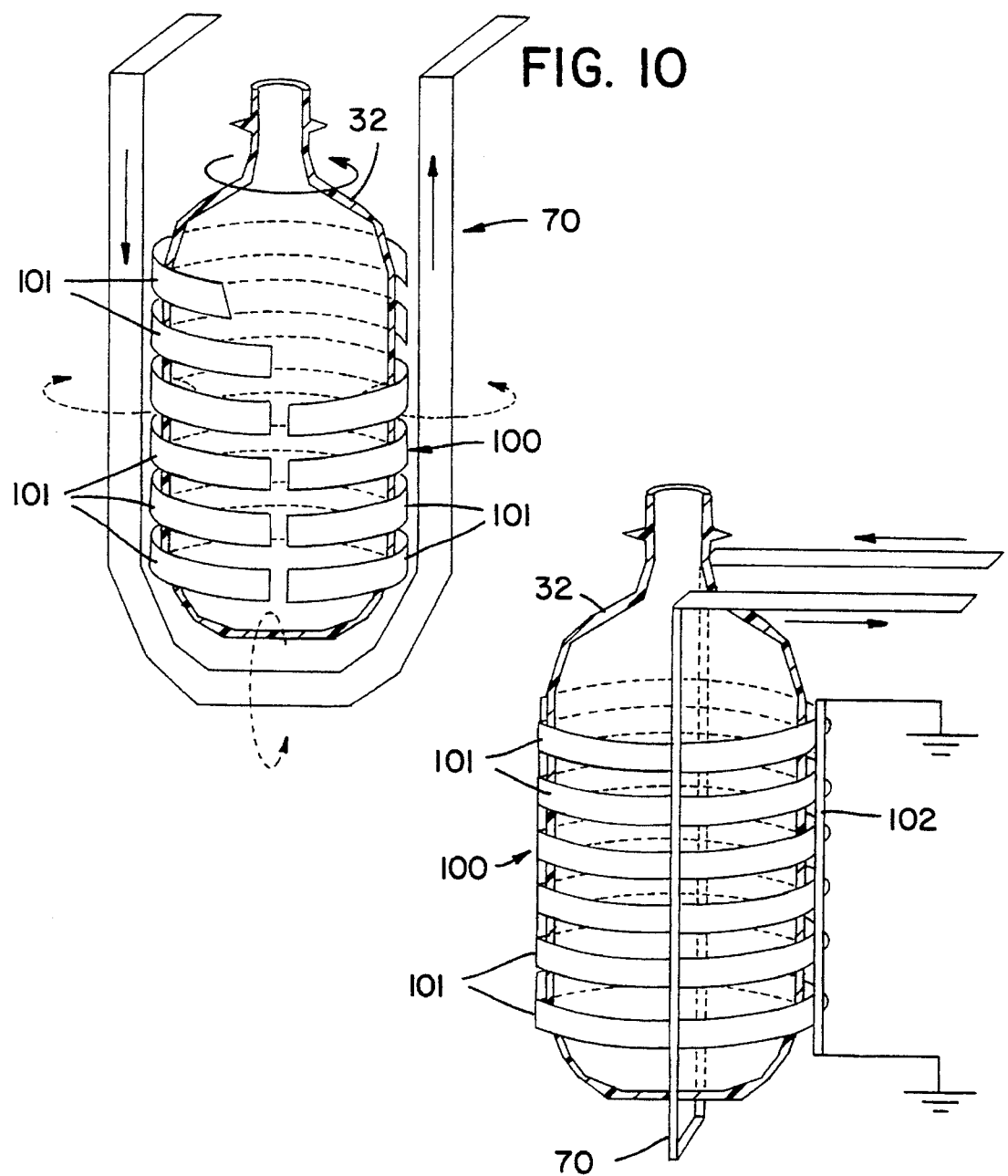

METHOD AND APPARATUS FOR PLASMA SURFACE TREATMENT OF THE INTERIOR OF HOLLOW FORMS

This invention was made with United States Government support awarded by NSF, Grant #ECD-8721545. The United States Government has certain rights in this invention.

FIELD OF THE INVENTION

This invention relates generally to plasma processing apparatus, and particularly to RF induction plasma processing apparatus for depositing thin films on or surface treating the interior of a hollow form.

BACKGROUND OF THE INVENTION

Plasma processing is used in the surface treatment of a variety of materials. For example, plasmas are used in semiconductor processing to clean or etch surfaces, and in depositions on the surfaces. Plasmas may also be used in cleaning a variety of materials, including metals, and in deposition of ions, free radicals, and other species from the plasma, either onto the surface of the material to provide surface coating, or into the bulk of the material. The use of plasmas in the treating of polymer surfaces has drawn increasing attention. See, e.g., G. Menges, et al. "Plasma Polymerization—Tailored Coats for Plastic Mouldings" Kunststoffe German Plastics, Volume 78, Number 10, 1988, pp. 91–92; P. Plein, et al. "Plasmapolymerization as Coating Process for Plastic and Metallic Parts," Antec '88, 1988, pp 1338–1341; R. Ludwig, "Plasmapolymerization—A New Technology for Surface Modification," Antec '89, 1989, pp. 915–917; J. T. Felts, et al., "Commercial Scale Application of Plasma Processing for Polymeric Substrates: From Laboratory to Production," presented at 38th Annual Symposium and Topical Conferences of the American Vacuum Society, Seattle, Wash., Nov. 11–15, 1991 and published in J. Vac. Sci. and Technol., A10, p. 1675, 1992.

The ability to use a plasma to produce a surface treatment or deposition solely on the interior surface of a hollow form having a re-entrant shape such as a bottle or gas tank is of great commercial importance. For example, gases and solvents permeate into walls of various plastics such as polyethylene terephthalate (PET) and high density polethylene (HDPE), that are commonly used for producing containers used in packaging. Permeation of materials reduces the shelf life of products in such packaging and can leave the container unsuitable for future packaging applications. By using plasma deposition to deposit a barrier coating film such as hexamethyldisiloxane (HMDSO) on the interior surface of the container, such permeation through the container may be severely curtailed, and shelf life greatly extended. Also, plasma treatments may be used to treat the interior surfaces of glass and plastic containers to alter the appearance of the surface or to enhance adhesion of metals or plastic materials to the treated container.

In using plasma processing to treat containers, it is important to ensure that the plasma discharge breaks down solely inside the container to be treated rather than inside the overall vacuum chamber where the plasma processing takes place. The reaction should occur only inside the container, but not inside the vacuum chamber. This would be beneficial, cutting down on high maintenance requirements of vacuum chambers within which deposition is occurring.

One of the largest maintenance problems occurring in plasma deposition apparatuses is thick film formation on the plasma source components and interior surfaces of the vacuum chamber in which the deposition takes place. After plasma-deposited films reach a thickness greater than 10 μm, internal stresses in the film may delaminate it. Massive delamination results in undesirable macroscopic particles which can contaminate further processing. These macroscopic particles are generated by films deposited on source parts or on vacuum chamber walls. Time consuming maintenance must be performed to remove these films and particulates. Thus, it is desirable to have a plasma processing source in which preferably no film is ever deposited on the power coupling components or interior walls of the vacuum chamber.

Most conventional plasma generating machines are not designed to treat polymeric bodies and forms. However, a few methods are known by which plasma sources have been adapted to deposit films on the interior of a hollow form. One method which has been adapted to deposit films on the interior of a hollow form utilizes a microwave driven plasma source. See, e.g., P. Plien, et al., "Plasmapolymerization as Coating Process for Plastic and Metallic Parts," supra. This approach has some technical complications, however. Microwave power sources and wave-guide components are expensive and often difficult to custom design. Also, to avoid non-uniformities in processing complex forms, electromagnetic field scatterers or workpiece rotation may be required to disrupt "hotspots", as in conventional over-molded microwave cavity ovens.

Another previous system designed for plasma-assisted film deposition or treatment of hollow containers consists of a capacitively coupled plasma system to drive a low pressure gas discharge within the form. See German Patent No. DE 3,908,418, H. Grunwald, issued Sep. 20, 1990. Such a method also has disadvantages, including a potentially lower deposition and treatment rate for mass produced applications. In addition, capacitively coupled plasma systems utilize high plasma sheath energies which may result in excess heating of sensitive plastic walls of the container resulting in container damage. This design is also complicated and may require expensive and regular maintenance due to film deposition on power coupling components.

Present inductively-coupled plasma processing systems also have disadvantages. Such systems require expensive conformal dielectric vacuum boundaries, and may be difficult to adapt to a wide variety of forms with complex geometries.

SUMMARY OF THE INVENTION

In accordance with the present invention, an RF induction apparatus is used to generate a plasma to treat the surface or deposit a thin film upon the interior of hollow dielectric forms. The apparatus of the present invention has a vacuum chamber enclosure in which one or more radio frequency (RF) induction coils are mounted to form an induction coil system. The coil system defines a space herein described as a "working volume." The working volume is surrounded by the coil system, and a hollow form is placed into the working volume for plasma treatment. The invention is not limited to treating regularly shaped hollow forms, such as cylinders (e.g., plastic bottles) or spheres, but may utilize specially shaped coils or multiple coils to treat complex forms (e.g., fuel tanks). This invention allows control of the field applied to the plasma in the working volume within the vacuum enclosure, which can be used to tailor the form of the plasma to best treat a particular work piece.

A hollow form is placed in the vacuum chamber in the working volume and mechanically sealed about its mouth opening in such a manner that the interior of the form is sealed off from the vacuum chamber outside of the form. The interior of the form and the vacuum chamber are evacuated (i.e., pumped down) and the interior of the form is provided, through a gas feed line, with a processing gas to be ionized. The absolute pressure inside the form is maintained higher than the absolute pressure outside the form. The working volume conforms to at least a portion of the hollow form. High RF currents are driven on the coil through high current RF feed-throughs so as to drive a resonating current on the coil system. The RF induction coil system is supplied with RF power at any desired RF frequency, with typical commercial RF heating frequencies including 450 kHz, 13.56 MHz, and 27.1 MHz. The RF power signal may be pulsed at lower audio frequencies to extend the stable power and pressure operating range of the plasma. Because the processing gas is separated from the coil(s) by the dielectric walls of the form, no dielectric panel is required as in conventional equipment, and the RF coil can be mounted in the vacuum chamber. Doing so allows the RF coil to be placed much closer to the wall of the form than has heretofore been possible, and allows the coil to have a configuration which matches the form since no external dielectric wall is interposed between the coil and the form. Because the interior of the form is sealed off from the exterior, the pressure of the gas within the form can be high enough so that the gas in the form breaks down under the applied electric field, whereas the pressure of the gas outside the form may be low enough that it does not break down.

The present invention is well suited to treatment of complex hollow forms, such as those formed of molded plastic. To treat forms having protruding portions, two or more RF induction coils having a variety of geometric shapes can be utilized to efficiently treat the interior of the form. The coils are not limited to a cylindrical configuration, but may be, for example, rectangular or U-shaped. The RF electric field applied by the coils breaks down the gas within the form to provide a coating on the interior surface of the form. Multiple coils may be driven by a single RF power supply, or may be driven independently by separate power supplies. Further, multiple coils of separate current carrying elements within the coils, with appropriate connection of the RF power supply to such coils, can allow the distribution of the RF induction fields to be tailored to enhance or control the spatial distribution of the plasma, as desired, to obtain uniform processing of complex shaped hollow forms. Tailored fields can also be obtained, if desired, using a single coil having electrically separated turns which are separately supplied with RF power.

Further objects, features and advantages of the invention will be apparent from the following detailed description when taken in conjunction with the accompanying drawings.

BRIEF DESCRIPTION OF THE DRAWINGS

In the drawings:

FIG. 10 is a front view of a portion of apparatus of the invention with a Faraday shield and an alternative induction coil configuration.

FIG. 11 is a side view of the portion of the apparatus of FIG. 10.

DETAILED DESCRIPTION OF THE INVENTION

Figure 1:
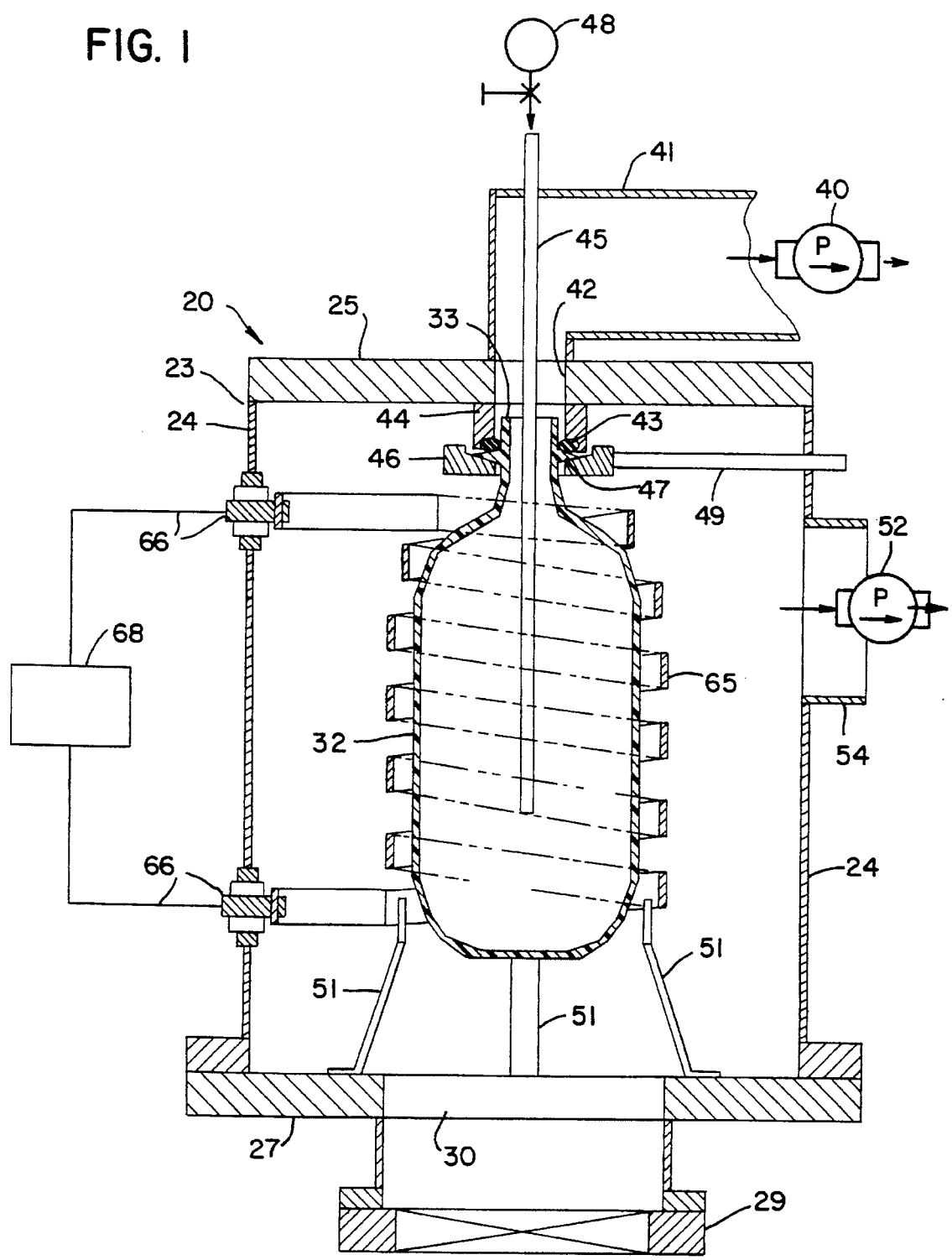
FIG. 1 is a cross-sectional view of an RF plasma processing apparatus in accordance with the invention.

With reference to the drawings, an apparatus for carrying out a plasma treatment of an interior of a hollow dielectric form in accordance with the present invention is shown generally at 20 in FIG. 1 in cross-section. As used herein, plasma treating or treatment includes all acts by which a work piece may be modified by the plasma, including implantation, deposition of coating from the plasma, and plasma etching, cleaning and chemical surface modification.

The apparatus 20 includes a vacuum chamber enclosure 23 having a cylindrical side wall 24, a top closure plate 25 and a bottom closure plate 27. In the exemplary apparatus 20, the enclosure which defines the vacuum chamber also includes a bottom load lock gate valve 29 mounted to the bottom plate 27 to cover a central opening 30 therein, and sealed to the bottom closure plate 27. The load lock gate valve 29 provides a gate within the vacuum chamber enclosure 23 which can be opened to allow a hollow form 32 to be placed within and removed from the vacuum chamber 23. When the gate is closed, the vacuum chamber is sealed from the ambient atmosphere. Any suitable mechanical conveyance, not shown, may be used to move the hollow form 32 through the opening 30 in the load lock gate 29 and position the hollow form 32 within the vacuum chamber 23. The hollow form has a mouth opening 33 but otherwise forms an enclosed vessel.

A process pump tube 41 is joined to the top closure plate 25 at an opening 42 defining a form access port in the plate to allow communication between the tube 41 and the interior of the form 32. The interior of the hollow form 32 is evacuated by a vacuum pump 40 connected to the tube 41 prior to or during the introduction of the gas to be ionized through a tube 45 from a controlled gas source 48 (e.g., a gas canister and flow controller) into the interior of the form 32. A circular gasket 43 is mounted on the interior face of a ferrule 44 extending from the plate 25 and surrounds the port 42. An annular sealing ring 46 engages a flange 47, formed at the top of the form 32, against the bottom of the gasket 43 to hold the hollow form 32 in place within the vacuum chamber 23 to provide communication between the mouth opening 33 and the ports 42 in the vacuum chamber enclosure, while sealing off the vacuum chamber from the interior of the hollow form. The ring 46 is supported for movement by a lever 49. Any other desired structure may be used to provide such communication and sealing, including hooks, twist mounts, threaded engagement of the form to the enclosure, etc.

Transfer guides 51 guide the hollow form 32 to a correct position within the vacuum chamber as it is passed through the open port 29, and align the flange 47 with the sealing gasket 43. After the hollow form 32 is locked in place, the load lock gate valve 29 is sealed so that the vacuum chamber 23 may be evacuated by the action of a vacuum pump 52 through a vacuum chamber access port 54 simultaneously as vacuum is applied via the tube 41 to the interior of the form 32.

The vacuum chamber enclosure walls 24, 25, and 27 may be formed of conventional materials, e.g., aluminum or stainless steel, or ceramics, etc., with appropriate dielectric linings for the interior of the chamber, if desired. The vacuum chamber 23 and the form 32 may be evacuated using conventional pumps 40 and 52 (which under appropriate control may be the same pump) connected to the vacuum port 54 and the tube 41. More than one vacuum port may be placed in one or more of the walls of the vacuum chamber enclosure 23 to evacuate the chamber to the desired pressure level.

Figure 2:
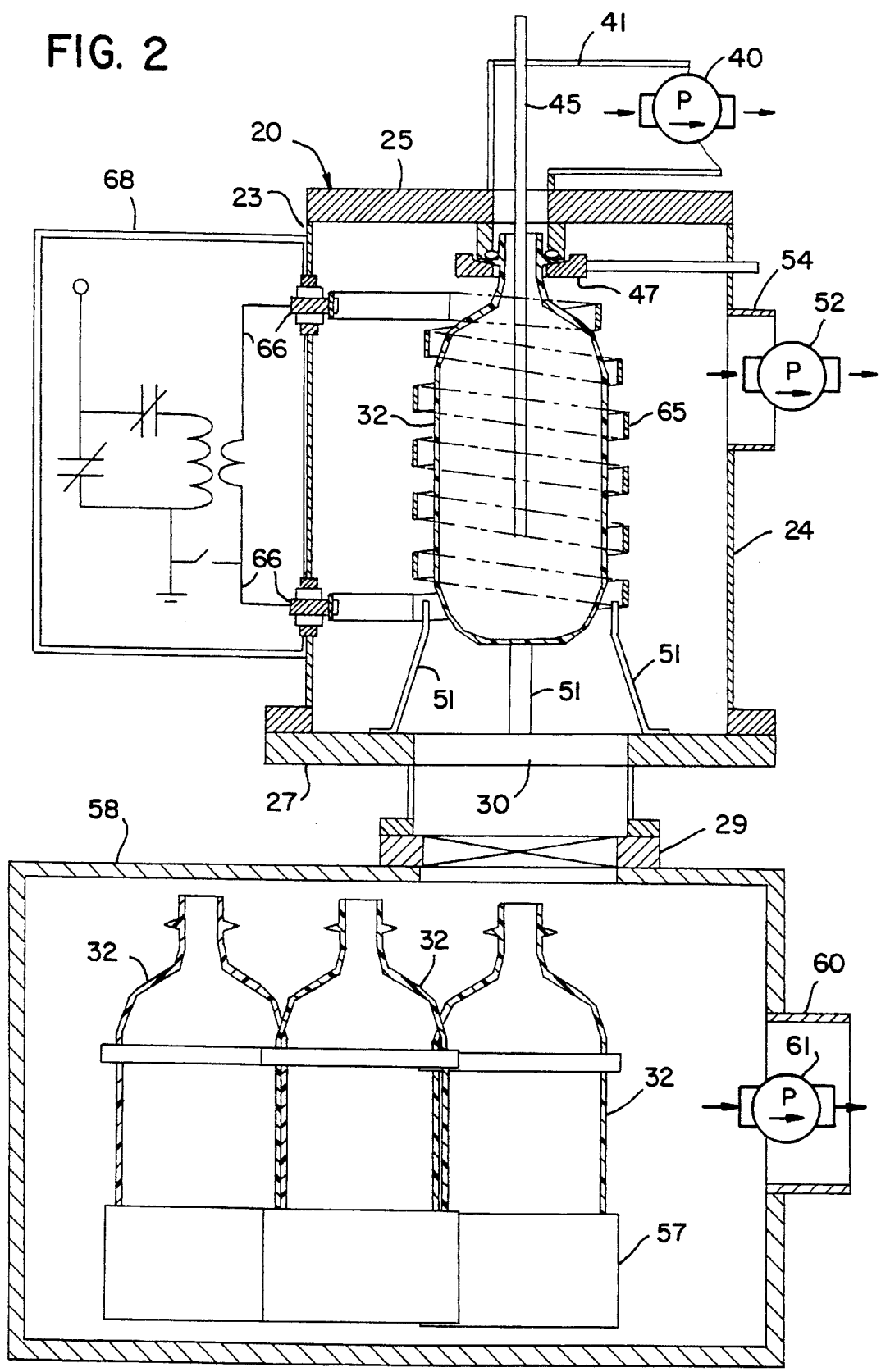
FIG. 2 is a cross-sectional view of an RF plasma processing apparatus which is adapted for the rapid processing of multiple hollow forms by use of a load lock chamber.

As shown in FIG. 2, an automated magazine 57 can be used to provide a feed of several hollow forms, and is located within a load lock chamber 58. The load lock chamber 58 may be operated under vacuum and evacuated through a vacuum pump tube 60 by a vacuum pump 61. The automated magazine 57 may be operated by means of appropriate timing and power devices so as to supply hollow forms to be treated one at a time through the port lock 29 without having to completely evacuate the chamber 23 after each form is treated, thereby allowing several forms 32 to be treated more quickly.

A spiraled RF induction coil 65, defining a generally cylindrical shape, is mounted in the vacuum chamber enclosure 23. Power is supplied to the coil 65 by high current feed lines 66 which extend through the side walls of the vacuum chamber enclosure 23. The coil 65 is formed and situated such that when the hollow form 32 is sealed in place, the coil 32 surrounds a volume in the vacuum chamber which is defined herein as the working volume. The hollow form 62 is inserted into the working volume such that a small and approximately equal gap is maintained between the exterior of the hollow form 32 and the coil 65. The coil 65 may be wound in any appropriate shape, depending on the shape of the form 32, so as to surround and conform in size and shape to at least a portion of the hollow form to be treated.

The hollow form 32 may be comprised of various dielectric materials, such as thermal set plastics (e.g., PET or HDPE), or glass. Examples of dielectric materials which can be treated and exemplary treating gases are given in Table 1 below.

TABLE 1

| Gas Feed Material | Dielectric Material | Objective |
|---|---|---|
| Helium, Argon, Nitrogen, Oxygen, Ethylene, Methane, Acetylene | Forms made from hydrocarbon polymers, fluorocarbon polymers, elastomers and thermoplastics | Surface cleaning and roughening to alter the surface energy (e.g., increase or wettability). |
| HMDSO (hexamethyldisiloxane) | PET forms, polyester sheet, PMMA, glass | Deposition of thin, pin-hole-free $Si_xO_yC_z$ films |
| $CF_4$, $C_2F_6$, $CHF_3$ | Polyethylene containers (and other hydrocarbon polymers) | Surface fluorination and generation of Teflon-like films on hydrocarbon surfaces |
| Ar/Methane mixtures | Glass containers and lenses | Diamond-like-carbon films |
| Oxygen/Argon mixtures | ABS plastic containers (e.g., CRT, computer, phone or other electronic enclosures). | Oxidation, cleaning and roughening of surfaces, formation of chemically active surface |
| Oxygen or Air | Polyolefin moldings | Generation of reactive carbonyl and carboxyl groups on surface for strong hydrogen bonding at interfaces |

Figure 3:
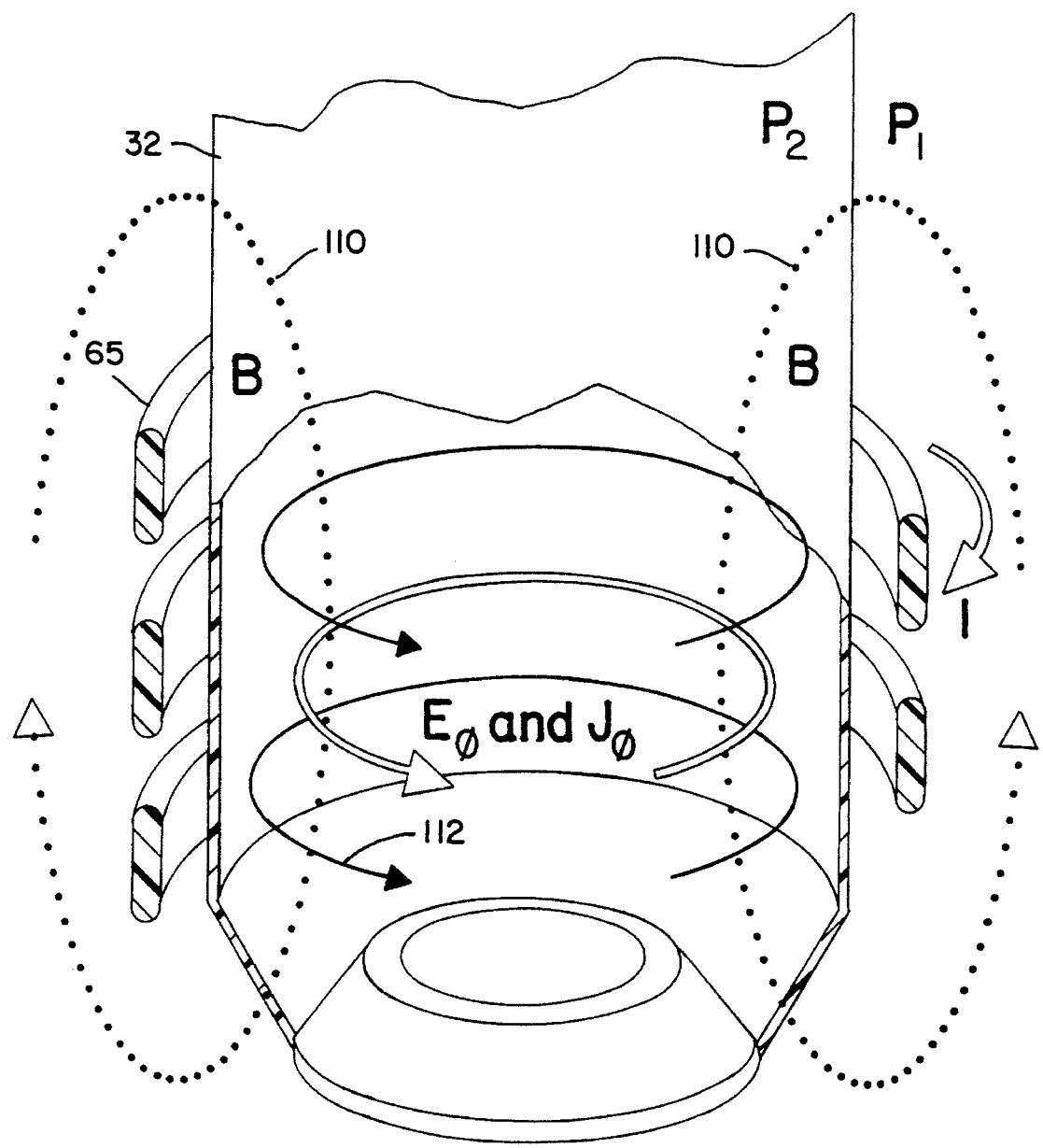
FIG. 3 is an illustrative view of field lines within the form being treated.

High RF currents (near 20–60 $A_{p-p}$ at 13.56 MHz) are applied to the coil 65 through the high current RF feedthroughs 66 from an RF power source 68. The power source may include a matching network, e.g., may be an inductor in series with a capacitor with $C \cong 1/(\omega^2 L)$, to drive a resonating current on the coil. These currents, in turn, drive induction fields, $B_z$ and $E_\phi$, within the interior of the hollow form 32 to create a plasma in the gas introduced in the interior of the form 32. FIG. 3 illustrates these field components within the interior of the hollow form 32.

While FIGS. 1, 2 and 3 illustrate the apparatus of the invention using spiral induction coils, many other coil shapes may be used as long as the effective RF electric field is of sufficient strength within the form to allow appropriate plasma formation and deposition rates. The RF electric fields should extend into the interior of the form with adequate strength to sustain the gas discharge. The strength of the electric field generally should be at least $|E|>2$ V/cm at 13.56 MHz.

Figure 4:
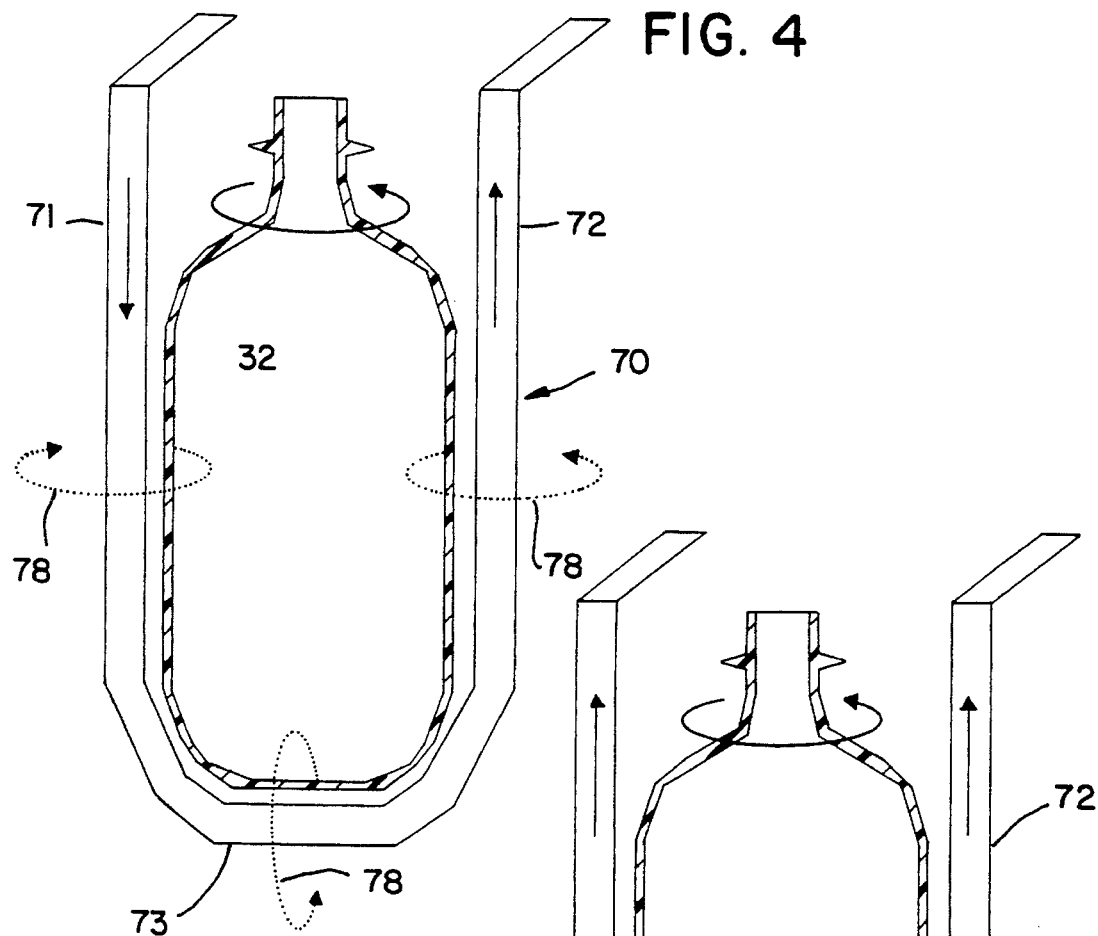
FIG. 4 is a view of an alternative coil construction that may be used with the present invention.
Figure 5:
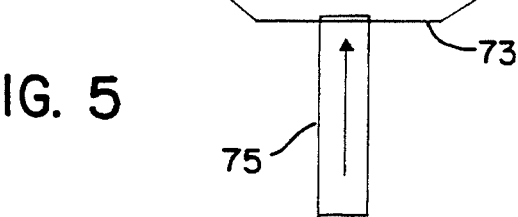
FIG. 5 is a view of a further alternative coil construction that may be used with the present invention.

FIGS. 4 and 5 show, for exemplification, two other coil configurations and illustrate the orientation of the RF magnetic field about each coil. The coil 70 of FIG. 4 has a single turn of conductor with legs 71 and 72 extending parallel to the axis of the generally cylindrical form 32, and a stub 73 connecting the legs 71 and 72 which extends adjacent the bottom of the form 32. Currents flow down (and up) the leg 71, across the stub 73, and up (and down) the leg 72. In the coil structure of FIG. 5, a conductor 75 is connected to the middle of the stub 73 and current is conducted from the conductor 75 through the stub 73 and up (or down) both legs 71 and 72. The dashed lines 78 indicate the lines of magnetic field for current directions as shown. In the apparatus of FIGS. 4 and 5, the hollow form 32 can be rotated through the induction field provided by the "U-shaped" coil 70 to improve the uniformity of the deposited film or surface treatment if necessary.

Figure 6:
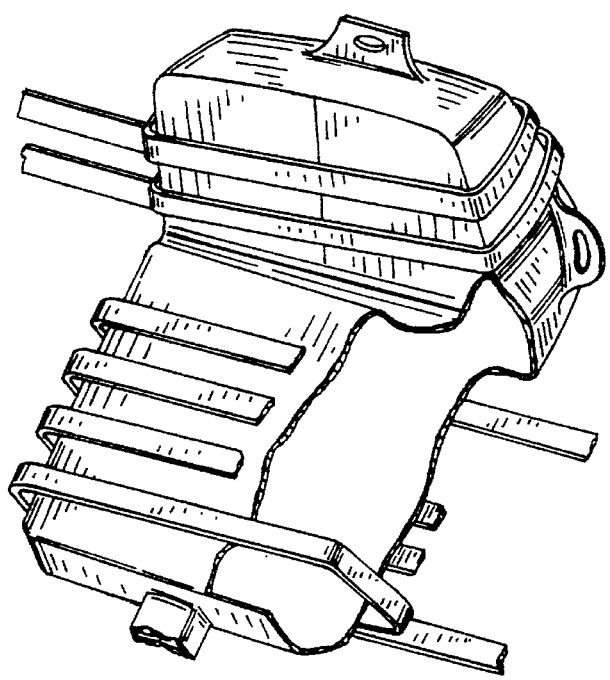
FIG. 6 is a perspective view of an exemplary RF induction coil system utilizing multiple RF induction coils about a complex container shape.

Numerous designs of coils may be used to suit a variety of different geometric forms. Multiple coils, ganged together on single or separate power circuits, may also be configured to create a multi-coil processing unit or to treat complex single-piece forms having distinct portions, such as a plastic automobile fuel tank 80 as shown in FIG. 6. In this configuration, a first coil 81 extends closely around an upper portion 83 of the tank 80, and a second coil 85 extends closely around a lower portion 86 of the tank.

As noted above, the gas to be ionized is fed from the supply 48 through the feed tube 45 which extends through an opening in the wall of the process pump tube 41, and into the interior of the hollow form 32, as shown in FIGS. 1 and 2. The gas feed material may be, by way of example only, helium, hexamethyldisiloxane, fluorine, carbon tetrafluoride, trifluoromethane, methane, oxygen, air, pyrolized tetrafluoroethylene homopolymer, or a combination thereof. Table 1 above also lists various gases and exemplary uses. When RF power is supplied to the drive coil 65, in the manner described further below, the feed gas within the form is ionized to generate a plasma from the gas within the form adjacent to its inner wall surfaces. As also explained further below, the generation of the plasma within the interior of hollow form is highly uniform over the inner surface of the form, and can apply plasma treatment uniformly and simultaneously to the entire interior surface of the form.

Figure 7:
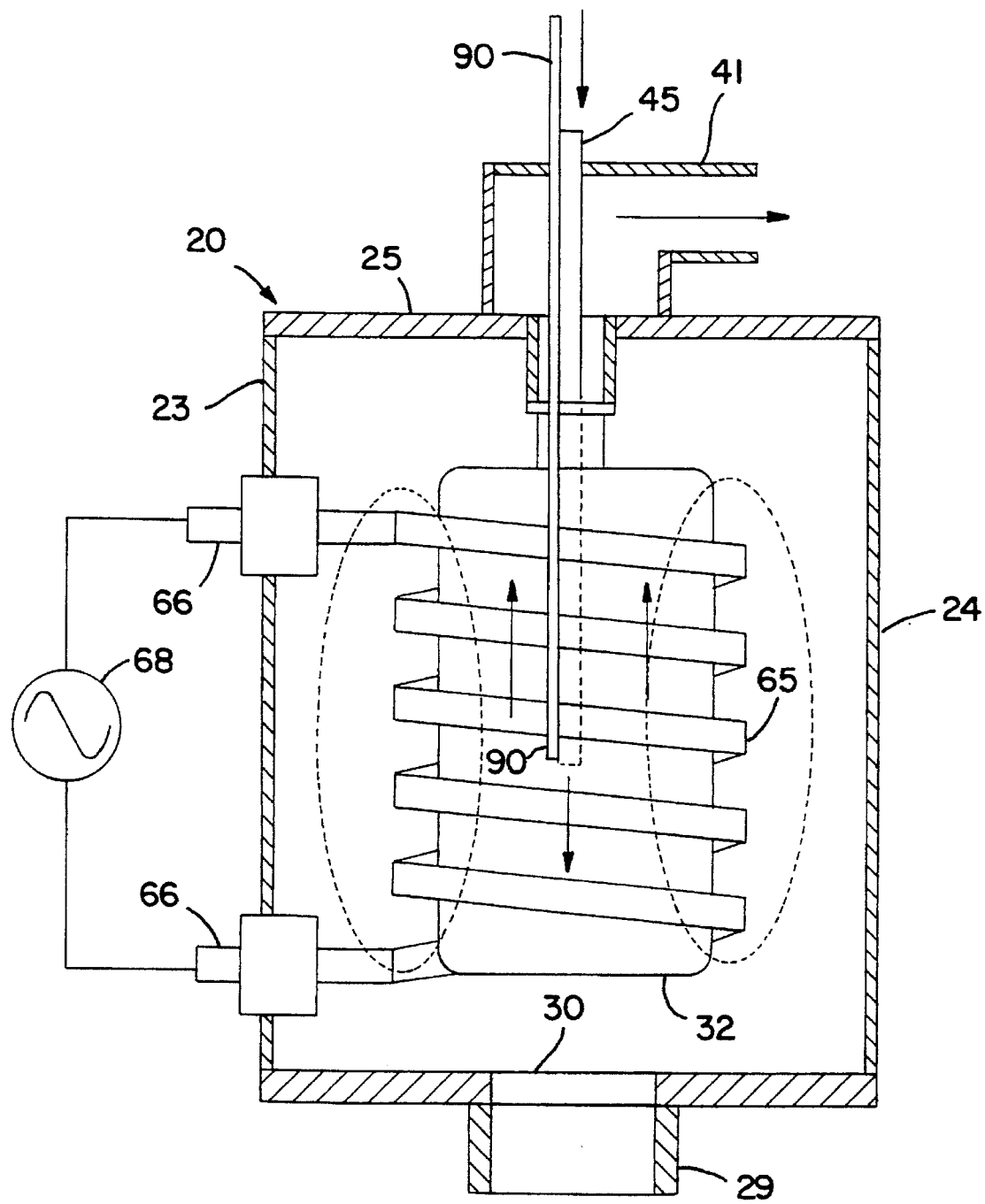
FIG. 7 is a cross-sectional view of a plasma processing apparatus adapted to allow in situ optical emission spectroscopy.

A fiber optic probe line 90 may be used in the apparatus of the present invention as shown in FIG. 7. The fiber optic probe line 90 preferably extends into the hollow form 32 adjacent to the gas supply tube 45. In processes in which etching or deposition does not disturb the probe, the fiber optic probe line may be utilized with a spectrometer (not shown) to measure optical emission spectroscopy information in situ from the plasma discharge during the plasma emission process.

The apparatus of the present invention is capable of operating over a wide range of partial vacuum pressures both within the vacuum chamber enclosure 23 and within the hollow form 32. The vacuum pressure within the vacuum chamber should preferably be 0.1 mT or lower to minimize plasma generation within the vacuum chamber, and the pressure within the hollow form 32 may range from, for example, 0.030 to several Torr. The interior pressure within the form is maintained by appropriate adjustment of the gas supplied through the tube 45, and the gas pumped out by the pump 40, as shown in FIG. 1. Generally, the pressure inside the form 32 will be higher than the pressure outside the form in the vacuum chamber, allowing even relatively flexible walled forms to be treated. The pressure differential across the walls of the hollow form is sufficiently low so as not to produce forces that could deform the form 32 or disengage the form from the sealing gasket 43. If the form used has more than one opening, temporary processing plugs in the form or mounting points in the chamber can be used to seal the form and contain the gas within the form and maintain the pressure differential.

Figure 8:
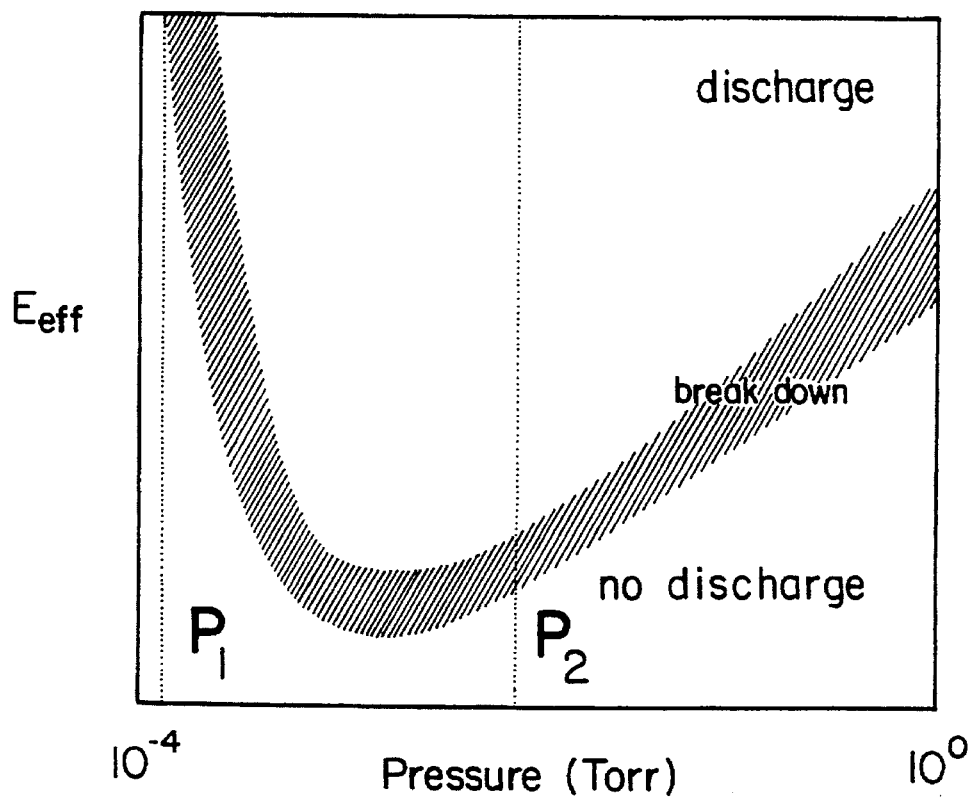
FIG. 8 is a graphical representation of a typical Pachean curve for discharge breakdown of a gas.

When proper pressure conditions are maintained inside and outside the form, the gas will break down only within the form. FIG. 8 shows an exemplary Pachean curve for breakdown of a gas wherein the breakdown transition region is shaded. Given a fixed geometry and gas pressure, a gas will break down when an electric field (or an effective electric field, $E_{eff}$, in the case of RF frequencies) of sufficient strength is applied through the gas. At pressures greater than about 500 mT, free electrons, which drive the ionization process, experience inelastic collisions with the neutral gas particles before being accelerated to energies needed to ionize the neutral gas particles during those collisions. Consequentially, as the pressure is increased, stronger electric fields are required to accelerate the electrons to a sufficient average kinetic energy to break down the gas. At very low pressure, less than 1 mT, the electrons are freely accelerated by the electric fields, but have so few collisions with neutral particles that ionization collision rates are not high enough to maintain a discharge. In this low pressure regime, very high electric fields are needed to generate very energetic electrons to drive the discharge. Between the two pressure exchanges there is an optimal break down pressure. By keeping the pressure $P_1$ outside the form at an extremely low pressure, typically less than 0.1 mT, and the pressure $P_2$ in the form in the range of about 30 to 500 mT, the fields applied will only break down the gas within the form.

Figure 9:
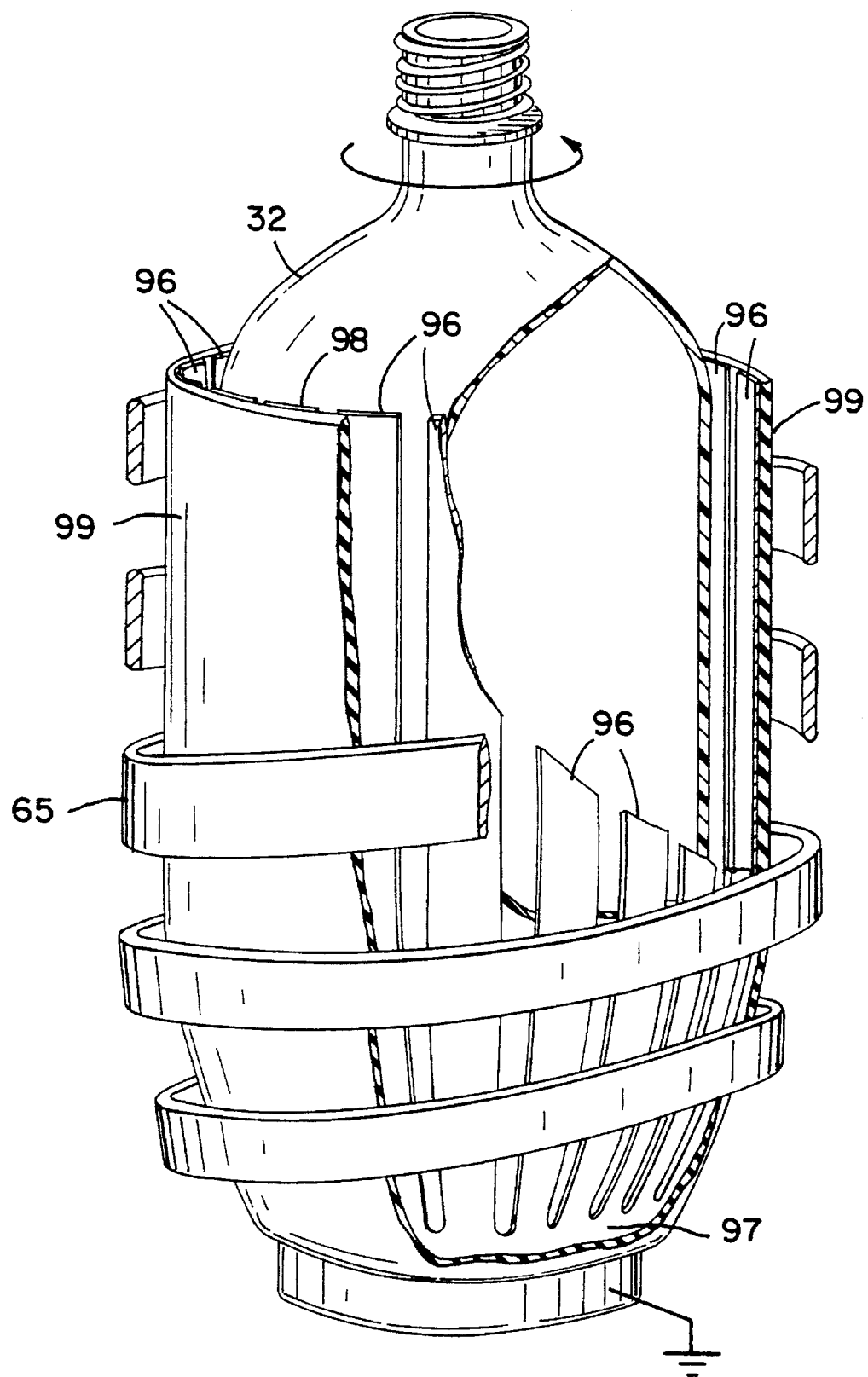
FIG. 9 is a perspective view of a portion of the apparatus of the invention which incorporates a Faraday shield.

Many RF induction sources exhibit high voltage drops along the coil, which can drive quasi-electrostatic fields or capacitive fields. When these fields couple to the plasma, they can drive localized RF cathode effects near structures in the form and high energy plasma sheaths beneath the coil. These are referred to as capacitively-coupled hot spots. When working with hollow forms which may be formed from thermally-sensitive materials like polyethylene or polyethyleneterephthalate, such hot-spots are undesirable because they can result in localized, thermal degradation of the form. One way by which the capacitive coupling may be inhibited is to employ a Faraday shield, as shown in FIG. 9 at 95. The Faraday shield 95 comprises sets of spaced, parallel fingers 96 which extend upwardly from an electrically grounded common base 97 to form an inner shield layer 98. An outer dielectric layer 99 surrounds the fingers 96 of the inner layer 98 and is in close contact with them. The inner shield layer 98 may be made of various conducting materials, for example, copper, aluminum or combinations thereof. The outer dielectric layer 99 is formed of a vacuum compatible dielectric insulator, for example, glass, mica, polymers (e.g., polyimide), etc. The insulating layer 99 prevents any possible arcing between the coil 65 and the grounded conducting shield layer 98. The insulating layer 99 may not be required if a relatively high vacuum is maintained and spacing between the shield 98 and the coil 65 is adequate. The two shield layers are held together by appropriate means, including mechanical connectors such as screws, rivets, staples or the like, or the two shield layers may be bonded together adhesively. The fingers 96 are separated from each other to define axially extending slits between them. As illustrated in FIG. 9, the shield 95 is preferably coextensive in length with the coil 65 and the Faraday shield is grounded at its base 97.

The capacitive coupling allowed through the shield 95 to the interior of the form 32 may be controlled by selection of the shape and/or the dimensions of the fingers or the slits. The Faraday shield 95 shorts out quasi-electrostatic fields associated with capacitive coupling while allowing RF magnetic fields to penetrate through the shield into the interior of the working volume and induce electric fields and discharge currents within the hollow form 32.

As illustrated in FIG. 9, the shield 95 is oriented so that it remains spaced slightly away from the hollow form 32 so that the shield is thermally isolated from and not in physical contact with the exterior of the thermally sensitive hollow form 32.

The Faraday shield may be shaped and sized to match the configuration of a variety of RF induction coil shapes used in the present invention. FIGS. 10 and 11 show examples of Faraday shields configured for axially oriented RF coils of the types shown in FIGS. 4 and 5. A "U-shaped" RF induction coil 70 is shown in FIGS. 10 and 11 for illustration. The exemplary Faraday shield 100 is formed of several split cylindrical rings 101 which are disposed around the hollow form to be treated. The Faraday shield 100 remains spaced away from the hollow form 32 so as to prevent thermal damage to the form. As shown in FIG. 11, the rings 101 of the Faraday shield 100 are preferably connected to a common conductor 102 which is grounded to hold the rings 101 at ground. The grounded conductors of the shield generally should be positioned in a direction orthogonal to the RF current flow in the induction coil or coils.

The RF induction coil 65 is connected by high current feed lines 66 to an RF power supply 68 as illustrated in FIG. 1. The RF power supply provides drive power to the coil 65 at a desired RF frequency, which may be typical RF commercial heating frequencies, e.g., 13.56 MHz. The RF input power may be pulsed at lower frequencies, e.g., audio frequencies, to extend the stable power and pressure operating range of the plasma.

Discharge formation and film formation are closely linked to the induced electric field structure formed in inductively coupled plasma sources. To optimize uniformity of the processes, the spacing of turns to each other in the coil and the spacing of the turns to the form may be tailored to optimize uniformity of the discharge within the form. Additionally, it may be necessary or desirable to rotate the hollow form within the coil using, e.g., a bearing as the ferrule 44 which is driven by an electric motor or other driver (not shown), and with a bearing provided on the clamp 46 to allow the form 32 to rotate freely.

Referring again to FIG. 3, it is seen that the magnetic induction field lines 110 extend in a closed path around the turns of the RF induction coil 65 and are generally axially oriented within the form 32, and that the electric field 112 induced by the RF induction coil is distributed through the volume of the hollow form generally circumferentially. It is understood that FIG. 3 is a highly simplified view for purposes of illustration. Only the electric and magnetic fields that are induced by the RF currents on the coil 65 are shown. Although the coil can sustain high RF voltages, and the quasi-static electric fields introduced by these voltages can capacitively couple RF power to the plasma within the hollow form 32, these electric fields are not shown in FIG. 3 for purposes of simplicity. If desired, Faraday shields of conventional design, as previously discussed, can be mounted between the coil 65 and the hollow form 32 to restrict the degree to which the capacitive electric fields heat the plasma within the form.

Figure 12:
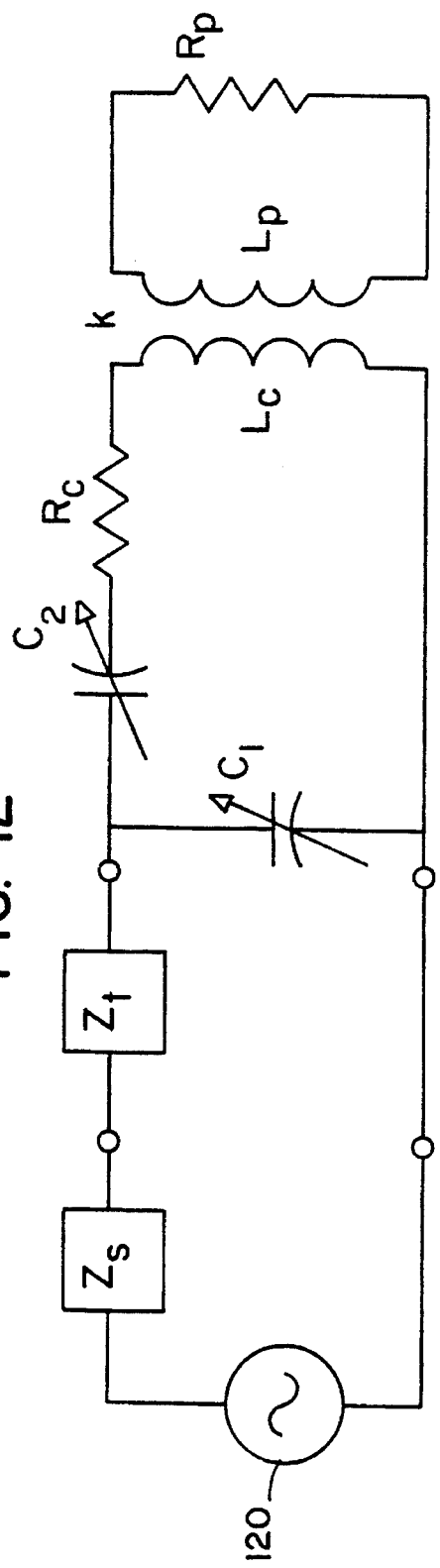
FIG. 12 is a schematic circuit diagram of an exemplary variable-capacitance impedance compensation network for an RF induction plasma source.
Figure 13:
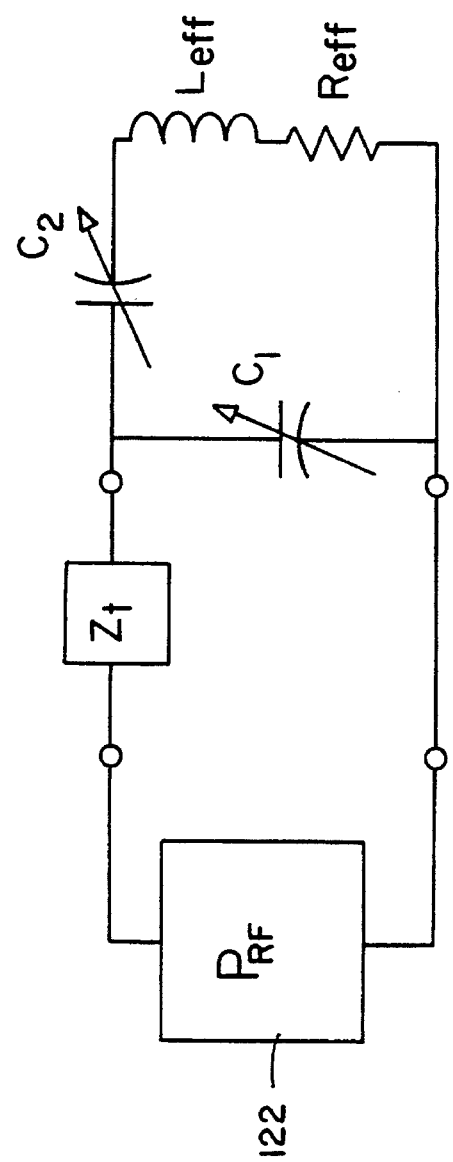
FIG. 13 is a simplified schematic for the circuit of FIG. 12.

A schematic circuit diagram of a lumped parameter circuit representation of the RF power supply 68, including an impedance matching network, and of the coil 65 inductively coupled to the plasma in the interior of the hollow form 32, is illustrated in FIG. 12. The power supply includes an RF power source 120 having a source impedance $Z_S$. A transmission line with electrical impedance $Z_t$ (typically a 5 ohm coaxial cable) conveys the power from the power source 120 to the power coupling system of the apparatus. The coil 65 has an inductance $L_c$ and the conductive discharge is represented by an inductance $L_p$ and a resistance $R_p$. The value of the coupling coefficient, K, between $L_c$ and $L_p$ depends on the design of the coil, the discharge operating conditions, the selection of materials of the apparatus, and the distance which separate the coil from the discharge. The transformer model for the coil and the discharge can be transformed into the equivalent circuit shown in FIG. 13 which has an effective inductance $L_{eff}$ and an effective resistance $R_{eff}$, with the ideal voltage source 120 and its impedance $Z_S$ shown lumped together as a source 122. The power supply can include compensation network capacitors $C_1$ and $C_2$ which serve to step up the voltage from the power supply to drive a strong RF current across $L_c$ and to transform the effective impedance from the power coupling system to match that of the power supply and the transmission line impedance. Typically, the values of $C_2$ and $L_{eff}$ are adjusted so that the circuit is near resonance at the RF driving frequency to drive the largest possible current for a given power supply voltage. Specifically, $C_2$ is selected such that:

$$C_2 \approx 1/(\omega^2 L_{eff}),$$

where $\omega$ is the RF driving frequency. The system of capacitors $C_1$ and $C_2$ forms an impedance matching network between the power source and the coils. Automated impedance matching networks are widely known in the art, and are commercially available from several manufacturers.

Figure 14:
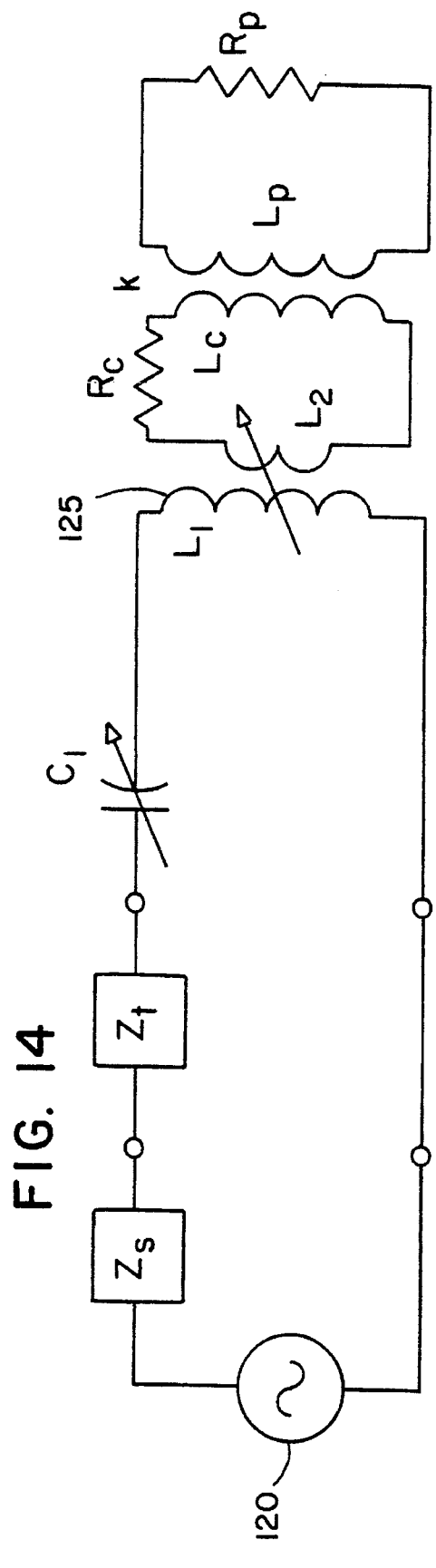
FIG. 14 is a schematic circuit diagram for a variable-transformer impedance compensation network for an RF induction plasma source.
Figure 15:
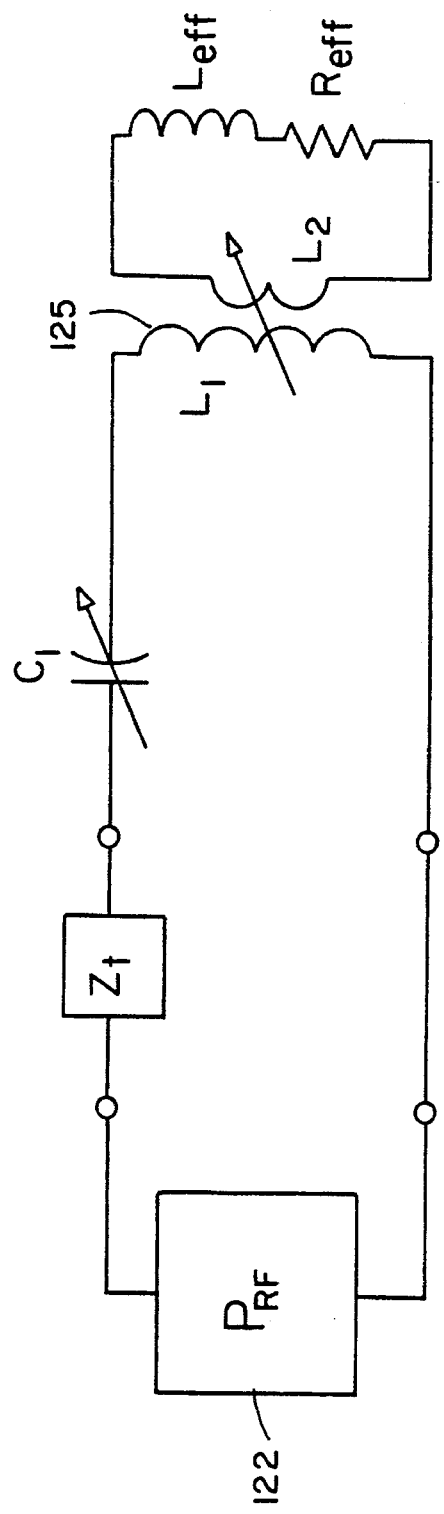
FIG. 15 is a simplified schematic for the circuit of FIG. 14 with effective inductance and resistance.

FIG. 14 illustrates an impedance matching network which has been developed for inductively-coupled plasma sources which uses a variable-transformer. The inductively-coupled plasma source, represented by characteristic $L_c$, $R_c$, k, $L_p$ and $R_p$, is connected to an additional variable-transformer stage 125 with primary and secondary windings, $L_1$ and $L_2$. By mechanically varying the coupling coefficient between $L_1$ and $L_2$, the effective impedance, $R_{eff} + j\omega L_{eff}$, is transformed to a range of values which may be subsequently matched to the power supply impedance through additional capacitive compensation by a variable-capacitor $C_1$. The variable-transformer model can be transformed into the equivalent circuit shown in FIG. 15 which has an effective inductance $L_{eff}$ and an effective resistance $R_{eff}$, with the ideal voltage source 120 and its impedance $Z_S$ shown lumped together as a source 122. The power supply can include the compensation network capacitor $C_1$ which serves to step up the voltage from the power supply to drive a strong RF current across $L_1$ and to transform the effective impedance of the power coupling system to match that of the power supply and transmission line impedance.

Figures 16, 17:
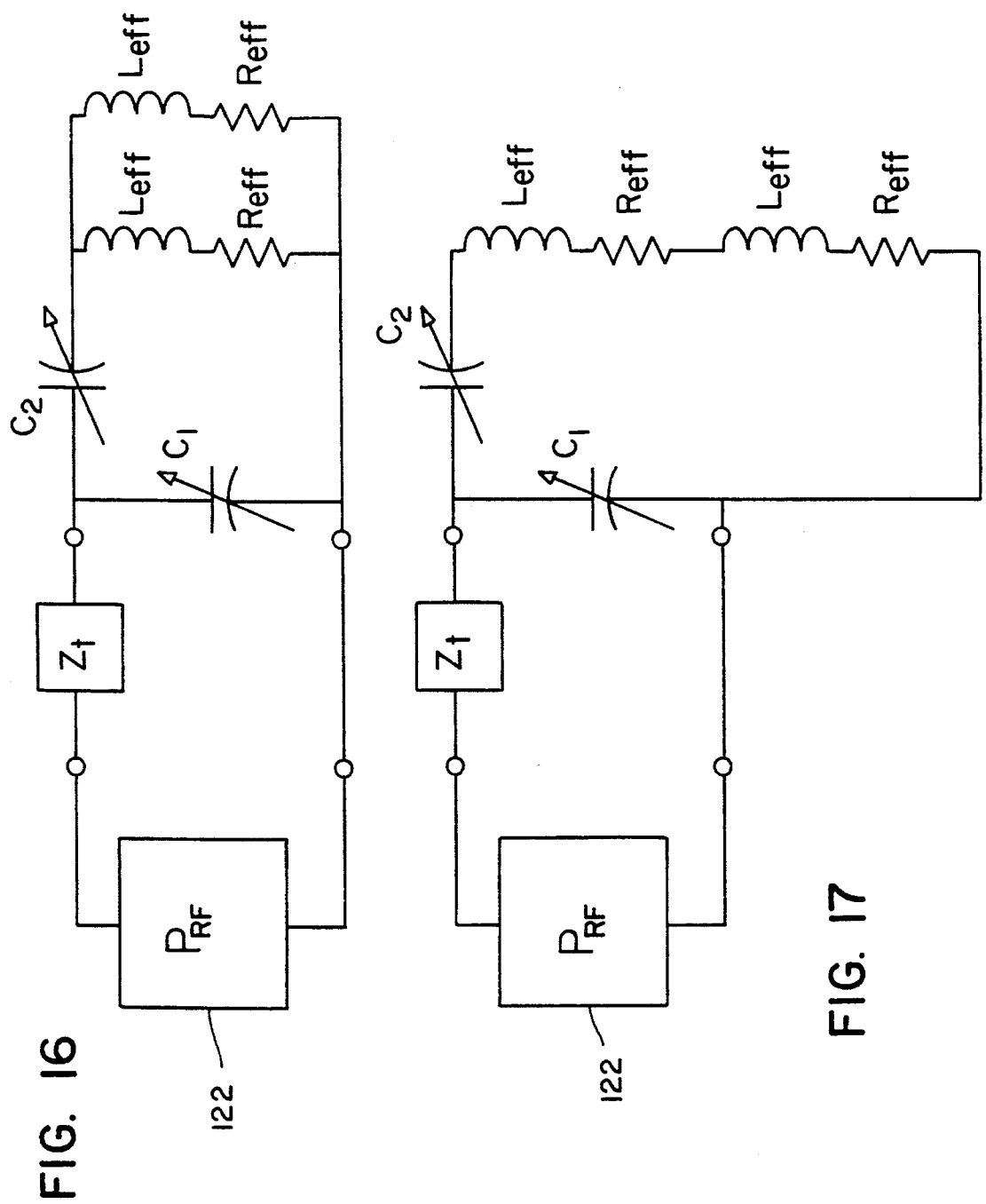
FIG. 16 is a schematic circuit diagram of a variable-capacitance impedance network for a multiple coil processing system.
FIG. 17 is a schematic circuit diagram of an alternative variable-capacitance impedance network for a multiple coil processing system.
Figures 18, 19:
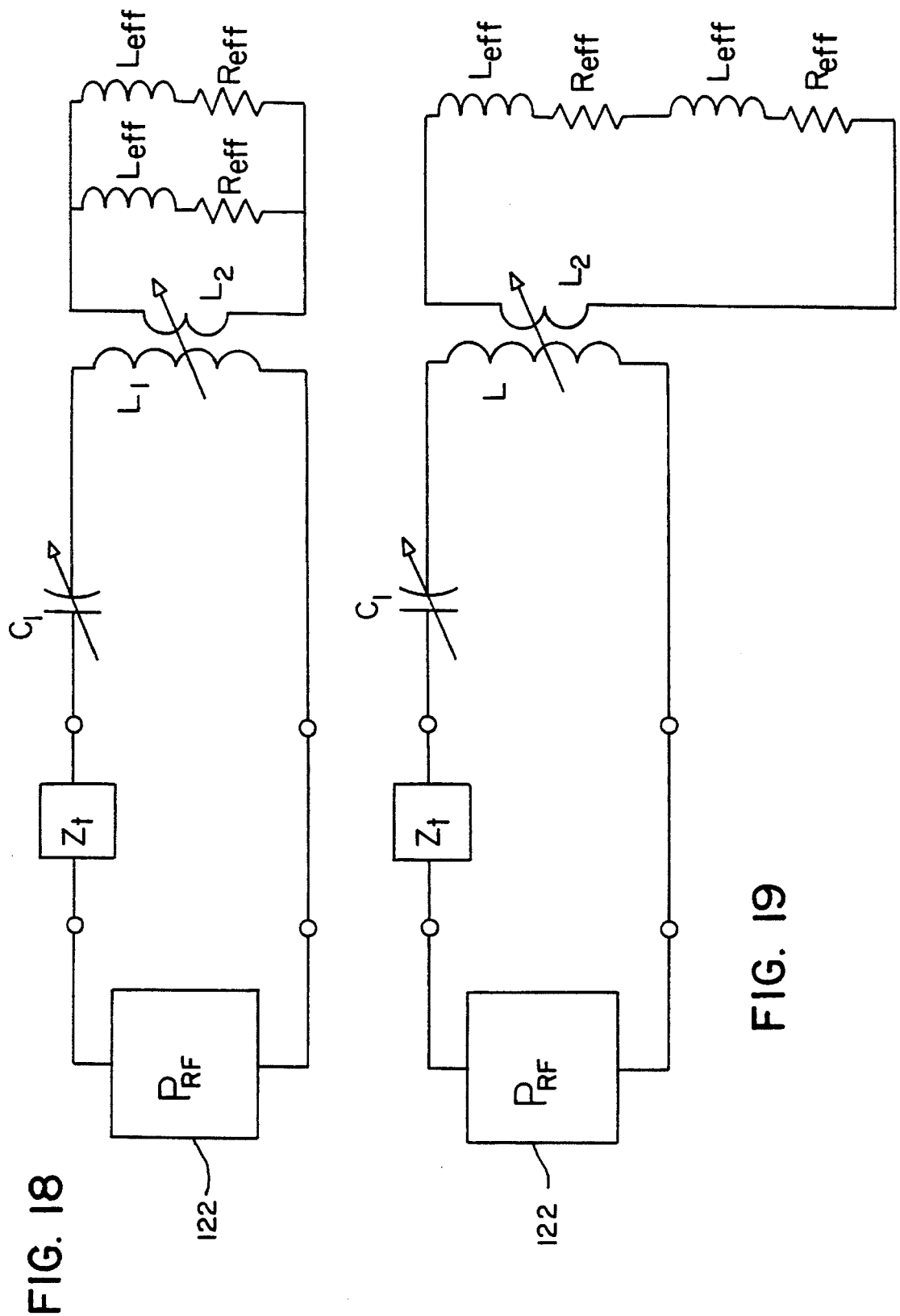
FIG. 18 is a schematic circuit diagram of a variable transformer impedance network for a multiple coil processing system.
FIG. 19 is a schematic circuit diagram of an alternative variable-transformer impedance network for a multiple coil processing system.

FIG. 16 is a lumped parameter circuit representation of a variable-capacitance impedance network for multiple coil processing systems. As shown in FIG. 16, an RF power supply having an RF power source 122 has two coil elements connected in parallel. FIG. 17 is a lumped parameter circuit representation of the RF power supply with two coil elements connected in series. FIGS. 18 and 19 are lumped parameter circuit representations of variable-transformer impedance networks for multiple coil processing systems. FIG. 18 is a representation of the RF power supply with two coil elements connected in parallel, whereas FIG. 19 illustrates an RF power supply with the two coil elements connected in series.

Commercially available power supplies can be utilized to drive the coil or coils of the present invention. Examples of suitable components are those available from RF Power Products, Inc. of Marlton, N.J., including RF power generators in the RFx series which operate at 13.56, 27.12 or 40.68

MHz, RF impedance matching networks in the AMx and the AMN-x001E series. Other suppliers of RF power systems and impedance matching systems are Electronic Navigation Industries of Rochester, N.Y., which produces power supplies and amplifiers for plasma systems, and RF Services, Inc., which produces computerized RF automatic matching networks for plasma matching systems. Although single coiled or linear RF induction coils have been shown for purposes of illustration, it is understood that additional coils and coil designs may also be utilized, as well as separately powered turns of a single coil.

It is understood that the invention is not confined to the embodiments described herein as illustrative, but embraces all such modified forms thereof as come within the scope of the following claims.

What is claimed is:

1. Plasma processing apparatus for treating the interior of a hollow dielectric form having a mouth opening comprising:

(a) an enclosure having walls defining a vacuum chamber, and a gate in the enclosure which can be opened to allow a hollow form to be introduced into the vacuum chamber and closed to seal the vacuum chamber;

(b) means for sealing the interior of a hollow form within the vacuum chamber while providing communication from the mouth opening of the hollow form to the exterior of the vacuum chamber and means for introducing a gas to be ionized into the interior of the hollow form;

(c) an electrically conductive radio frequency coil mounted within the vacuum chamber to define within the coil a working volume conforming to the hollow form to be treated, wherein at least a portion of the hollow form is in the working volume with the coil closely spaced to the hollow form when the form is in the vacuum chamber;

(d) a radio frequency power supply connected to provide radio frequency electrical power to the coil to induce an electric field in the working volume to excite the plasma in the gas contained within the hollow form; and (e) means for vacuum pumping the interior of the vacuum chamber and the interior of the hollow form, and wherein the means for introducing gas into the hollow form does so such that the pressure within the hollow form is higher than the pressure within the vacuum chamber outside the hollow form such that when electrical power is provided by the radio frequency power supply to the coil, a sufficient electric field is induced in the working volume to break down the gas within the hollow form but not break down the gas at the lower pressure within the vacuum chamber outside the hollow form.

2. The apparatus of claim 1 wherein the coil is formed of a continuous conductor having substantially circular turns to define a generally cylindrical working volume.

3. The apparatus of claim 1 wherein the coil is formed of a conductor having a single turn in substantially a U-shape which includes two leg portions and a stub portion connecting the leg portions, the coil formed to be positioned adjacent to and outside of a generally cylindrical hollow form.

4. The apparatus of claim 1 wherein at least two electrically conductive radio frequency coils are mounted within the vacuum chamber to define working volumes within each coil which conform to the size and shape of distinct portions of a hollow form.

5. The apparatus of claim 1 including an impedance compensation network connected between the radio frequency power supply and the coil.

6. The apparatus of claim 1 including a Faraday shield mounted between the coil and the hollow form, the Faraday shield connected to ground.

7. The apparatus of claim 6 wherein the Faraday shield includes an electrically conductive inner layer and an outer dielectric layer.

8. The apparatus of claim 1 including a fiber optic probe mounted within the vacuum chamber to monitor the plasma within the hollow form.

9. The apparatus of claim 1 wherein the gas introduced into the hollow form is selected from the group consisting of helium, argon, nitrogen, oxygen, nitrogen trifluoride, sulfur hexafluoride, ethylene, acetylene, hexamethyldisilazane, hexanethyldisiloxane, fluorine, carbon tetrafluoride, hexafluoroethane, trifluoromethane, methane, pyrolized tetrafluoroethylene homopolymer, $C_2F_4$, $C_3F_8$, air, and combinations thereof.

10. Plasma processing apparatus for treating the interior of a hollow dielectric form having a mouth opening comprising:

(a) an enclosure having walls defining a vacuum chamber, a gate in the enclosure which can be opened to allow a hollow form to be introduced into the vacuum chamber, a form port in the enclosure for communication with the hollow form, and another port in the enclosure for evacuating gas from the vacuum chamber;

(b) means for selectively sealing a hollow form to the enclosure to provide communication between the mouth opening of the form and the form port in the vacuum chamber while sealing the interior of the hollow form from the vacuum chamber;

(c) a pump in communication with the form port in the enclosure and a pump in communication with the other port in the enclosure to draw the pressure within the vacuum chamber enclosure and the form to low levels;

(d) means for introducing gas to be ionized into the interior of the hollow form to provide pressure within the hollow form higher than the pressure within the vacuum chamber outside the hollow form;

(e) an electrically conductive radio frequency coil mounted within the vacuum chamber to define a working volume which conforms to the hollow form and adapted to allow at least a portion of the hollow form to be inserted in the working volume when the form is within the vacuum chamber; and (f) a radio frequency power supply connected to provide radio frequency electrical power to the coil to induce an electric field within the working volume to excite a plasma in the gas contained within the hollow form without breaking down the gas in the vacuum chamber outside the hollow form.

11. The apparatus of claim 10 wherein the coil is formed of a continuous conductor having substantially circular turns to define a generally cylindrical working volume.

12. The apparatus of claim 10 wherein the coil is formed of a conductor having a single turn in substantially a U-shape which includes two leg portions and a stub portion connecting the leg portions, the coil formed to be positioned adjacent and outside of a generally cylindrical hollow form.

13. The apparatus of claim 10 wherein at least two electrically conductive radio frequency coils are mounted within the vacuum chamber to define working volumes within each coil which conform to the size and shape of distinct portions of a hollow form.

14. The apparatus of claim 10 including an impedance compensation network connected between the radio frequency power supply and the coil.

15. The apparatus of claim 10 including a Faraday shield mounted between the coil and the hollow form, the Faraday shield connected to ground.

16. The apparatus of claim 10 wherein the Faraday shield includes an electrically conductive inner layer and an outer dielectric layer.

17. The apparatus of claim 10 including a fiber optic probe mounted within the vacuum chamber to monitor the plasma within the hollow form.

18. A method for plasma treating the interior surface of a hollow dielectric form within a vacuum chamber enclosure, the form having inner and outer surfaces and a mouth opening, comprising the steps of:

(a) providing an electrically conductive radio frequency coil within the vacuum chamber which defines a working volume substantially conforming to the hollow form and which is closely spaced to the hollow form such that the hollow form is within at least a portion of the working volume of the coil;

(b) sealing the mouth opening of the hollow form to seal off the interior of the hollow form from the vacuum chamber outside the hollow form, evacuating the vacuum chamber and the hollow form, and introducing a gas to be ionized into the hollow form such that the pressure within the hollow form is higher than the pressure outside the hollow form within the vacuum chamber; and (c) providing radio frequency power to the coil to induce a radio frequency electric field in the working volume to excite the gas in the hollow form to produce a plasma within the hollow form at the pressure of the gas within the hollow form while not breaking down the gas in the vacuum chamber outside the hollow form.

19. The method of claim 18 wherein the gas introduced into the hollow form is selected from the group consisting of helium, argon, nitrogen, oxygen, nitrogen trifluoride, sulfur hexafluoride, ethylene, acetylene, hexamethyldisilazane, hexanethyldisiloxane, fluorine, carbon tetrafluoride, hexafluoroethane, trifluoromethane, methane, pyrolized tetrafluoroethylene homopolymer, $C_2F_4$, $C_3F_8$, air, and combinations thereof.

20. The method of claim 18 wherein the hollow form has distinct portions and wherein the step of providing an electrically conductive radio frequency coil comprises providing at least two coils, each coil defining a working volume conforming to one portion of the hollow form, and the step of providing radio frequency power provides power to each of the coils.

21. The method of claim 18 wherein the hollow form is made of a plastic dielectric material.

22. The method of claim 21 wherein the hollow form is made of a material selected from the group consisting of PET and high density polyethylene.

* * * * *